United States Patent

Apollonov et al.

[11] Patent Number: 6,101,206
[45] Date of Patent: Aug. 8, 2000

[54] LASER-DIODE DEVICE INCLUDING HEAT-CONDUCTING WALLS, SEMICONDUCTOR STRIPS AND ISOLATING SEALS AND PROCESS FOR MAKING LASER-DIODE DEVICE

[75] Inventors: Viktor Viktorovitch Apollonov; Guennadi Ivanovitch Babaiants; Serguei Igorevitch Derjavine; Batori Chakhimovitch Kichmakhov; Youri Petrovitch Koval; Vitali Vladimirovitch Kouzminov; Dmitri Aleksandrovitch Machkovski; Aleksandr Mikhailovitch Prokhorov; Viktor Pavlovitch Smekaline, all of Moscow, Russian Federation; Jean Cornillault, Nozay; Thierry Jean Daniel Xavier Foucher, Palaiseau, both of France

[73] Assignee: Compagnie Industrielle des Lasers Cilas, Marcoussis, France

[21] Appl. No.: 09/077,335
[22] PCT Filed: Sep. 26, 1997
[86] PCT No.: PCT/FR97/01696
 § 371 Date: May 27, 1998
 § 102(e) Date: May 27, 1998
[87] PCT Pub. No.: WO98/15041
 PCT Pub. Date: Apr. 9, 1998

[30] Foreign Application Priority Data

Sep. 30, 1996 [RU] Russian Federation ............. 96119588

[51] Int. Cl.[7] ............................... H01S 3/04; H01S 3/091
[52] U.S. Cl. .................................. 372/50; 372/36; 372/75
[58] Field of Search .................................. 372/34–36, 50, 372/75

[56] References Cited

U.S. PATENT DOCUMENTS

| | | | |
|---|---|---|---|
| 5,099,488 | 3/1992 | Ahrabi et al. | 372/36 |
| 5,128,951 | 7/1992 | Karpinski | 372/50 |
| 5,495,490 | 2/1996 | Rice et al. | 372/34 |

FOREIGN PATENT DOCUMENTS 0 687 047  12/1995  France ............................... H01S 3/25

OTHER PUBLICATIONS

Beach et al., "Modular Microchannel Cooled Heatsinks for High Average Power Laser Diode Arrays", IEEE Journal of Quantum Electronics, vol. 28, No. 4, Apr. 1, 1992, pp. 966–976.

Patent Abstracts of Japan, vol. 015, No. 054 (E–1031), Feb. 8, 1991 and JP 02 281781 A (Matsushita Electric Ind. Co. Ltd.), Nov. 19, 1990.

*Primary Examiner*—Teresa M. Arroyo
*Assistant Examiner*—Quyen P. Leung
*Attorney, Agent, or Firm*—Marshall, O'Toole, Gerstein, Murray & Borun

[57] ABSTRACT

Laser device with semiconducting diodes. The invention concerns a device with semiconducting laser diodes comprising individual wafers (8), made of a good heat-conducting material, assembled parallel to one another with semiconducting diode connector bars (9) placed between them as braces, said connector bars only taking up a longitudinal portion of the spaces between the wafers, in which they are located, and the longitudinal portions (17) of said spaces between the wafers, not taken up by said semiconducting connector bars, being used as flow channels for a cooling fluid.

7 Claims, 3 Drawing Sheets

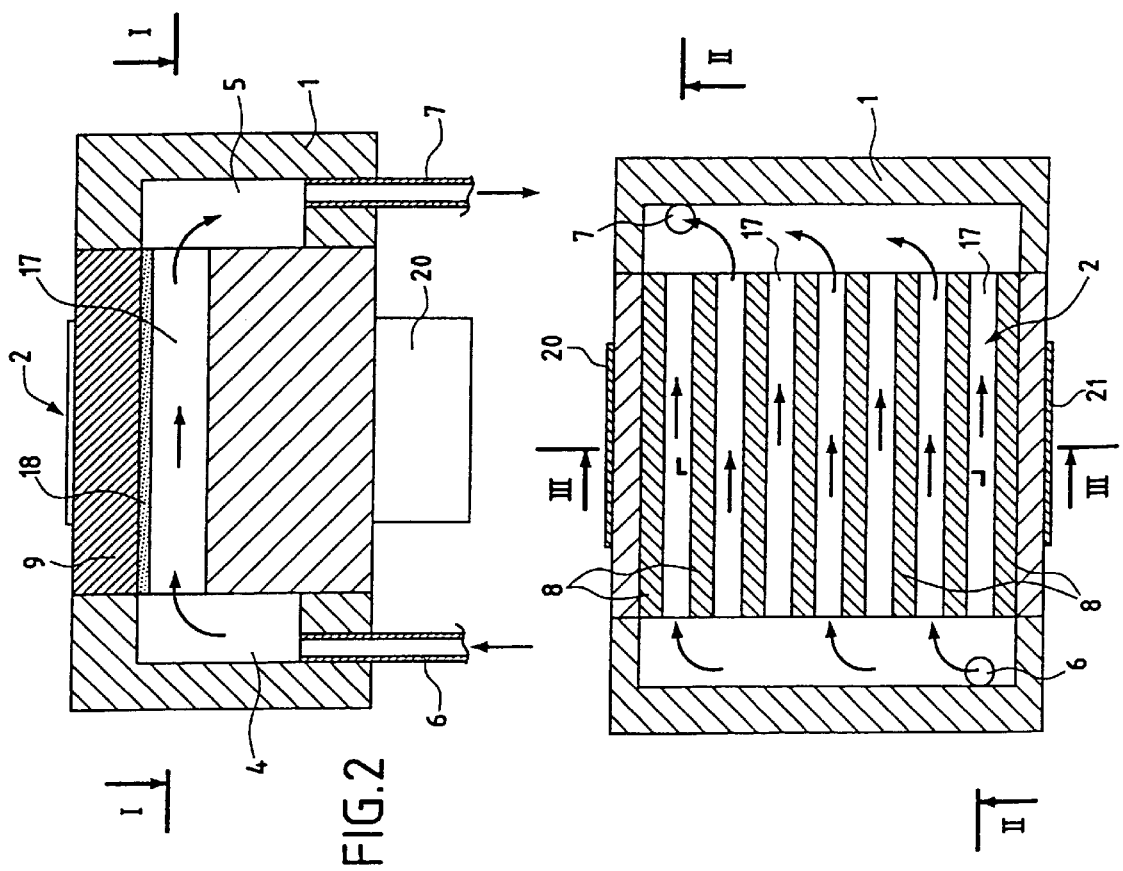

LASER-DIODE DEVICE INCLUDING HEAT-CONDUCTING WALLS, SEMICONDUCTOR STRIPS AND ISOLATING SEALS AND PROCESS FOR MAKING LASER-DIODE DEVICE

BACKGROUND OF THE INVENTION

The subject of the present invention is semiconductor laser diode laser devices and, in particular, such devices consisting of an array of laser diodes. It also relates to a process for producing such laser devices.

A laser diode device is known, for example from U.S. Pat. No. 5,128,951, which has:

a plurality of parallel and spaced-apart walls, made of a material which is a good heat conductor, which have at least approximately coplanar free longitudinal edges bearing films of an electrically conductive material which extend on each side of said edges on both faces of said walls;

a plurality of semiconductor strips incorporating said laser diodes, each strip comprising an emitting surface via which the laser diodes of the corresponding strip emit, said semiconductor strips being housed longitudinally in the spaces between said walls and each of said semiconductor strips being fastened to the opposite faces of the two walls between which it is housed, so that said semiconductor strips are electrically connected in series by said films of electrically conductive material and so that the emitting surfaces of said semiconductor strips are at least approximately coplanar with said free longitudinal edges of said walls; and fluid-circulation cooling means intended for cooling said diode strips.

The known laser devices of this type include a block of material which is a good heat conductor, which is supported by said fluid-circulation cooling means. Parallel grooves are machined, mechanically or chemically, in said block, said grooves forming the housings for said diode strips and defining ribs between them, each of these ribs forming one of said walls to which said diode strips are soldered. On the opposite side from the free longitudinal edges of the ribs, the latter are joined together by a base which corresponds to that part of said block which is not cut into by said grooves and via which said block is connected to said cooling means.

Such known laser devices have many drawbacks.

First of all, the removal of the heat generated by said diodes is not good. This is because, between the diode strips and the cooling fluid, the heat must travel a long path which passes through the soldered joints between the strips and the ribs, along the height of said ribs, through said base and, finally, through the wall of said cooling means which supports said base. Moreover, in order to be able to house said strips in said grooves easily, it is absolutely essential to provide clearances which are compensated for by the solder. Consequently, the soldered joints between the diode strips and the grooves are thicker than would be sufficient to ensure electrical contact, so that the rate of heat transfer is reduced at said soldered joints. This heat transfer rate reduction effect is increased because of the fact that the planarity and rugosity of the side walls of the ribs cannot be optimized when cutting out said grooves. These known laser devices therefore cannot provide a high radiation density because the heat removal is insufficient. If a high radiation density is desired, the laser diodes therefore overheat and are rapidly destroyed.

Moreover, because of the necessary existence of clearances between the diode strips and the ribs and the impossibility of applying satisfactory pressure between said strips and said ribs during soldering, the continuity of the electrical contact between said diode strips may be defective, despite—or because of—the relatively large thickness of said soldered joints.

Furthermore, the machining of said grooves and the fitting and soldering of said strips in them require a very high precision, not very compatible with industrial manufacture and reasonable manufacturing costs.

SUMMARY OF THE INVENTION

The object of the present invention is to remedy these drawbacks. It relates to a laser device of the abovementioned type, in which heat removal is improved so that the homogeneity and radiation density of said laser device may be high and the lifetime of the latter may be long, the structure of said laser device improved in accordance with the present invention making it possible, in addition, to guarantee excellent electrical continuity between the diode strips and to allow low-cost industrial manufacture.

To these ends, according to the invention, the laser diode device of the abovementioned type is noteworthy:

in that said parallel and spaced-apart walls are formed by individual plates joined together, with said semiconductor strips interposed between them as spacers;

in that said semiconductor strips occupy only one longitudinal part of the spaces between plates, in which spaces they are housed; and in that those longitudinal parts of said spaces between plates which are not occupied by said semiconductor strips serve as circulation channels for said cooling fluid.

Thus, since the cooling fluid is in direct contact with said plates, there is optimum removal of the heat generated by the semiconductor strips. Moreover, since said plates can be prepared individually, it is possible for them to have a good planarity and a good rugosity (less than 20 ångströms), so that the thickness of the soldered joints with the strips can be minimized and so that the heat transfer at these soldered joints can be maximized. The diodes of said strips are therefore effectively cooled so that they can generate high radiation density without overheating or being destroyed.

Preferably, in order to produce the laser diode device according to the present invention, the process is carried out in the following manner:

a plurality of identical rectangular individual plates made of a material which is a good heat conductor are prepared, at least their two large faces and one of their longitudinal edges are polished and said polished longitudinal edges and the lateral regions contiguous with said polished large faces are covered with films of a material which is a good electrical conductor;

a plurality of identical rectangular semiconductor diode strips, one longitudinal edge of which serves as an emitting surface to said diodes and the two large faces of which are covered with electrically conductive contact films, are prepared;

the contact films of said strips are applied against the lateral regions of the films of electrically conductive material of said plates, between which are interposed electrically conductive fastening films; and said plates and said strips are fastened together through the action of said fastening films, with application of pressure.

By virtue of such a production process, especially of the application of pressure while the diode strips are being fastened to the thermally conductive plates, excellent electrical contact between the diodes is obtained. Moreover, this process removes all the difficulties associated with the aforementioned clearances and allows industrial manufacture with relatively low manufacturing costs.

The fastening films could be made of an electrically conductive adhesive. However, in a preferred embodiment, these fastening films consist of an electrically conductive solder. Preferably, such solder films are in this case supported by said lateral regions of the films of electrically conductive material of said plates.

According to a first method of implementing the process according to the invention:

a stack of all said plates and all said strips is produced so that:

each strip is interposed between two plates;

those longitudinal edges of said plates which are covered with a film of electrically conductive material are at least approximately coplanar;

the emitting surfaces of said diode strips are at least approximately coplanar with said longitudinal edges of said plates;

each contact film of a large face of a strip is superposed with a solder film of a large face of a plate; and the entire said stack is raised to a temperature corresponding to the melting point of said solder films, while at the same time subjecting said stack to pressure transversely with respect to said plates and strips, after which said stack is left to cool.

Thus, the assembly comprising said plates and said strips is produced in a single operation. However, in this case the tooling used for accurately superposing said plates and strips and maintaining them in position must be relatively complicated.

Thus, in order to allow simplification of this tooling, according to a second method of implementing the process according to the present invention, the process is carried out in the following manner:

during the preparation of said plates, one of said lateral films of conductive material of each plate is covered with a film of a first electrically conductive solder;

a plurality of subassemblies, each of which comprises a plate and a strip, are formed by superposing, each time, a plate and a strip so that the solder film of the plate is superposed with a contact film of the strip and so that the longitudinal edge of said plate is at least approximately coplanar with the emitting surface of the strip, then by raising each subassembly to a temperature corresponding to the melting point of said first solder while at the same time subjecting it to pressure transversely with respect to said plate and to said strip, after which said subassembly is left to cool;

in each subassembly, the other of said lateral films of conductive material of the corresponding plate is covered with a film of a second electrically conductive solder having a melting point below that of said first solder;

a stack of said subassemblies is formed by superposing them, each time so that the other contact film of the strip of one subassembly is applied against the film of said second solder of the plate of another subassembly and so that the longitudinal edges of all the plates are at least approximately coplanar with each other and with the emitting surfaces of said strips; and said stack of subassemblies is raised to a temperature corresponding to the melting point of said second solder, while at the same time subjecting said stack to pressure transversely with respect to said plates and strips, after which said stack of subassemblies is left to cool.

It will be noticed that this second method of implementing the process according to the invention makes it possible to control all said subassemblies before their assembly.

Preferably, the semiconductor laser diode device according to the present invention includes, in the spaces between plates, sealing means which isolate said strips from said cooling fluid.

In a preferred embodiment, the device according to the present invention includes a package provided:

with a housing for said one-piece assembly comprising the individual plates and the semiconductor strips;

with means for the intake of said cooling fluid into said housing; and with means for the discharge of said fluid out of said housing.

In this embodiment, said cooling fluid flows through the longitudinal parts of those said spaces between plates which are not occupied by said strips, passing through said housing of the package.

Advantageously, so as to ensure uniform flow of cooling fluid between said plates, said package includes an accumulation reservoir for said fluid, on the one hand, between said intake means and said housing and, on the other hand, between said housing and said discharge means.

BRIEF DESCRIPTION OF THE DRAWINGS

The figures of the appended drawing will make it clearly understood how the invention may be realized. In these figures, identical references denote similar elements.

FIG. 1 is a horizontal section, along the line I—I of FIG. 2, of an illustrative embodiment of the laser diode device according to the present invention.

FIG. 2 is a longitudinal section of said device, along the broken line II—II of FIG. 1.

FIG. 3 is a cross section of said device, along the line III—III of FIG. 1.

DETAILED DESCRIPTION OF THE PREFERRED EMBODIMENTS

The laser diode device according to the present invention, and shown in FIGS. 1 to 3, includes a package 1 and a one-piece assembly 2 comprising plates, made of a material which is a good heat conductor, and semiconductor laser diode strips.

Figure 6:
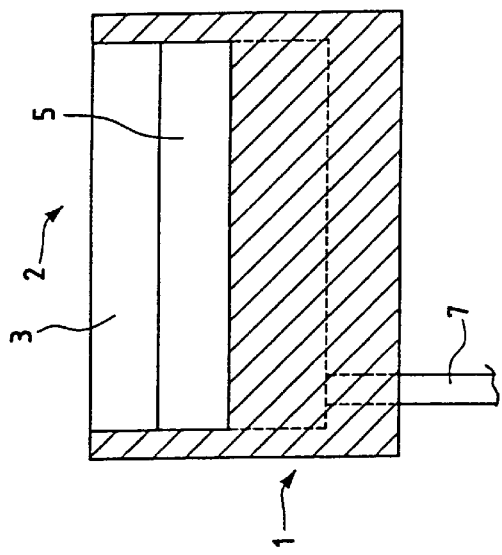
FIG. 6 is a cross section of said package, along the line VI—VI of FIG. 4.
Figure 5:
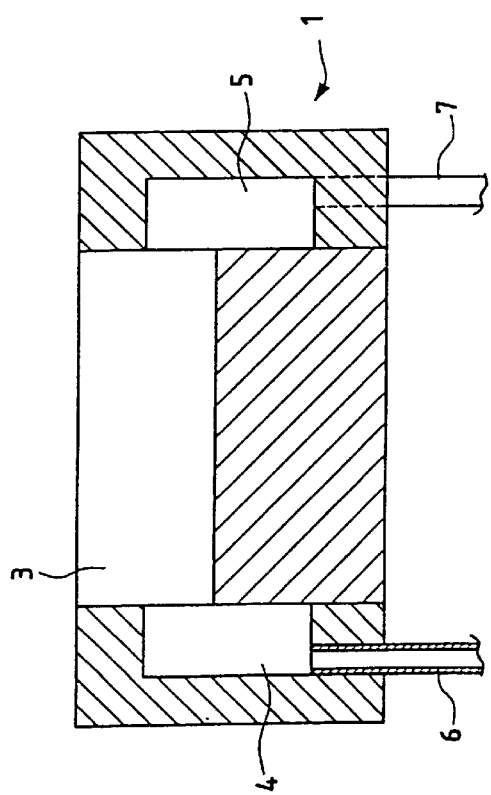
FIG. 5 is a longitudinal section of said package, along the broken line V—V of FIG. 4.
Figure 4:
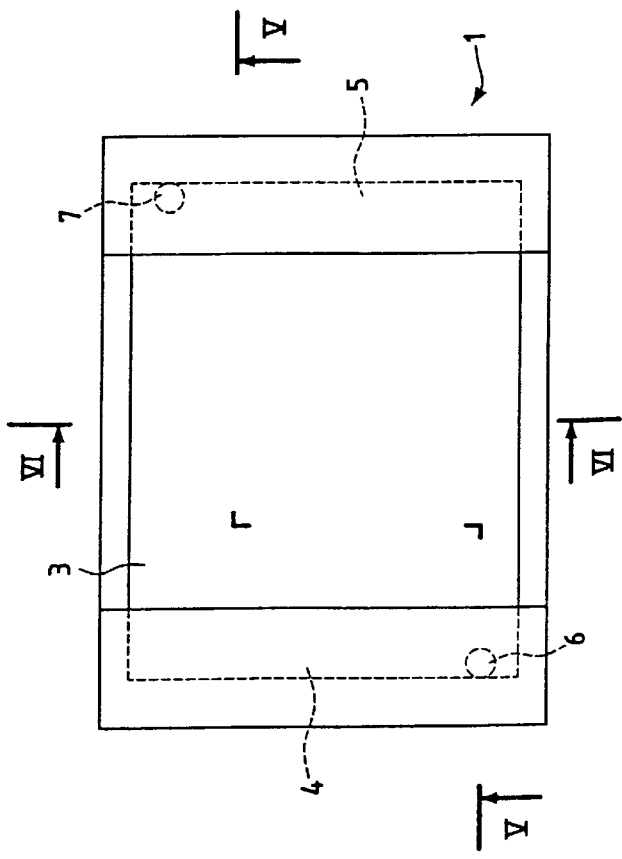
FIG. 4 is a top view of the package of the device of FIGS. 1 to 3.

In the illustrative embodiment shown in these figures and in FIGS. 4 to 6, the package 1 consists of several pieces, for example made of a metal such as aluminum or copper, joined together in a sealed manner. The package 1 includes a housing 3 into which the assembly 2 may be inserted and fixed in a sealed manner, for example by adhesive bonding. Provided on each side of the housing 3 are reservoirs 4 and 5 which communicate with the latter over its entire width. A fluid intake pipe 6 and a fluid discharge pipe 7 run, respectively, into the reservoirs 4 and 5, said pipes 6 and 7 being arranged diagonally with respect to each other in relation to the housing 3.

Figure 7:
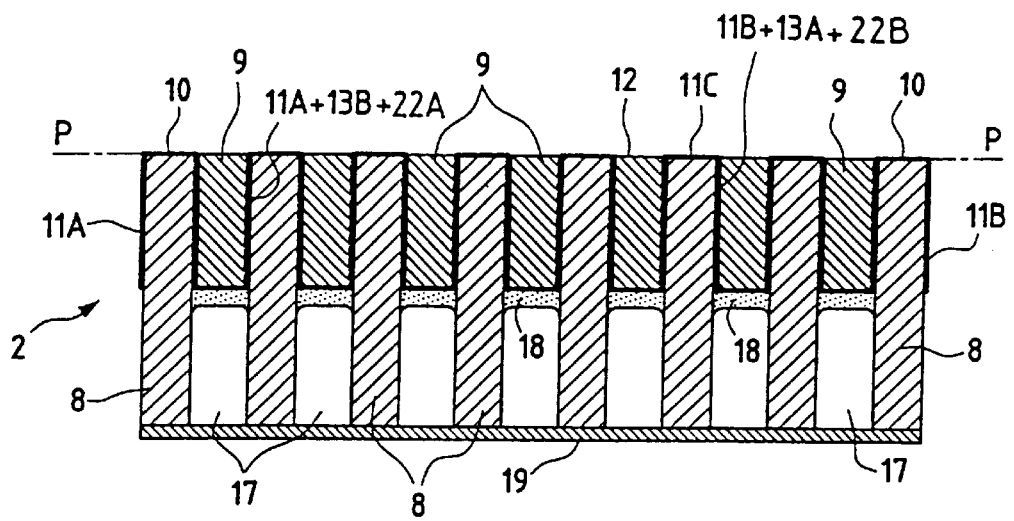
FIG. 7 is an enlarged cross-sectional view of the one-piece assembly comprising the individual plates and the semiconductor strips of the device according to the present invention.

As shown on a larger scale in FIG. 7, the assembly 2 comprises a plurality of parallel individual plates 8 joined to each other with, each time, a semiconductor strip 9 interposed between two consecutive plates and serving as a spacer.

Figures 8A, 8B:
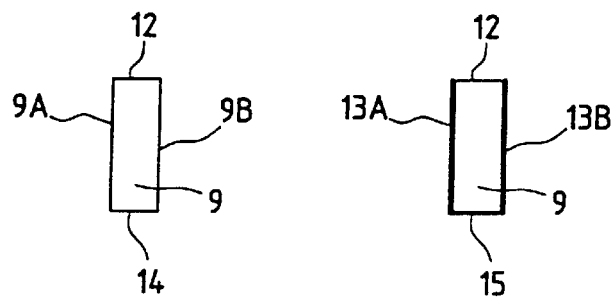
FIGS. 8A and 8B diagrammatically illustrate the preparation of said semiconductor strips for the purpose of producing said one-piece assembly.
Figures 8C, 8D, 8E:
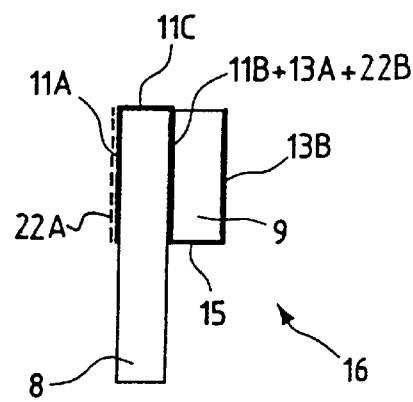
FIGS. 8C and 8D diagrammatically illustrate the preparation of said individual plates for the purpose of producing said one-piece assembly.
FIG. 8E diagrammatically illustrates the fastening of said plates to said strips.

The individual plates 8 are made of a material having a high thermal conductivity such as, for example, beryllium oxide BeO, silicon carbide SiC, diamond, etc. This material could also be a metal, but it is advantageous for it not to be an electrical conductor since then, as will be seen below, water can be used as a cooling fluid. In one particular illustrative embodiment, the individual plates 8 were all identical and had a rectangular parallelepipedal shape with a length of 1 cm, a width of 0.3 cm and a thickness of 0.02 cm. The free (upper) longitudinal edges 10 of the individual plates 8 are coplanar, as is diagrammatically illustrated in FIG. 7 by the line of a plane P—P. At least those parts of the large faces 8A and 8B of said plates 8 which are adjacent to said longitudinal edges 10 are polished in order to be strictly plane and have a rugosity of less than 20 ångströms. Moreover, as illustrated in FIG. 8D, each individual plate 8 is coated, before it is incorporated into the assembly 2, with a film 11 of electrically conductive material, including a part 11C covering its longitudinal edge 10 and lateral parts 11A and 11B which partially cover, heightwise, said large faces 8A and 8B. Such an electrically conductive film 11 may, for example, be made of molybdenum or nickel, or of an alloy of such metals, and its thickness may be between 50 and 200 microns. As illustrated in FIG. 8D, the lateral parts 11A and 11B of said film 11 are respectively covered with a film 22A or 22B of electrically conductive solder, for example made of an alloy of molybdenum, nickel and indium. Such a solder film may have a thickness of at most 10 microns.

In a known manner, the rectangular parallelepipedal semiconductor strips 9 may be obtained by cutting semiconductor substrates, in which said laser diodes are obtained by epitaxy, into bands. The strips 9 may have a length of 1 cm, a width of 0.15 cm and a thickness of 0.02 cm.

At least the large faces 9A and 9B of the semiconductor strips 9 are polished in order to be strictly plane and to have a rugosity of less than 20 angstroms. As illustrated by FIG. 8B, each semiconductor strip 9 is coated, before its incorporation into the assembly 2, with an electrically conductive contact film, for example made of gold, having a part 13A which covers the face 9A and a part 13B which covers the face 9B.

In order to concentrate the laser emission through the edges 12, the opposite edges 14 of said semiconductor strips may be covered with a reflective coating 15.

In order to obtain the assembly 2, an alternating stack of plates 8 and strips 9 may be produced so that the longitudinal edges 12 of the semiconductor strips 9, which form the emitting surfaces of the laser diodes, are coplanar with the longitudinal edges 10 of the plates 8 (see FIG. 7) and so that each strip 9 has its contact film 13A bearing against the solder film 22B of a plate 8 and its contact film 13B bearing against the solder film 22A of another plate 8 and then pressure may be applied transversely to said stack in order to press said solder films and said contact films against each other, while at the same time heating the entire unit (for example in a hydrogen oven) to a temperature at least equal to the melting point of said solder films. After cooling, the plates 8 and the strips 9 are fastened to each other by the solder films which, moreover, ensure that said semiconductor strips 9 are electrically connected in series by the interaction between said films 11 of electrically conductive material and said contact films 13A, 13B.

As a variant, it is possible to use, for producing the solder films 22B, a metal alloy having a melting point greater than that of the metal alloy used for producing the solder films 22A. Consequently, it is possible, in a first step, to produce subassemblies 16 (see FIG. 8E) each comprising a strip 9 and a plate 8 without the film 22A, the edges 10 and 12 of which are aligned, and which are fastened by the film 22B and then, in a second step, after producing the solder film 22A on said subassemblies 16, to stack said subassemblies 16 in order to fasten them by their solder films 22A. Of course, both during production of the subassemblies 16 and during their assembly, transverse pressure is applied to said plates 8 and strips 9 while the adhesive films are being melted.

Whatever the embodiment used to obtain the assembly 2, it is observed that the latter includes, between each pair of consecutive plates 8, a free longitudinal channel 17 not occupied by the corresponding semiconductor strip 9.

As shown in FIG. 7, each longitudinal channel 17 is isolated from the corresponding semiconductor strip by a seal 18, for example created by injecting a silicone or an epoxy resin. Optionally, a stiffening plate 19 is fixed to the longitudinal edges of the plates 8, opposite the longitudinal edges 10.

After producing said assembly 2, the latter is placed in and fixed in a leaktight manner (for example, by adhesive bonding) to the housing 3 of the package 1 so that its longitudinal channels 17 communicate, on one side, with the reservoir 14, and on the other, with the reservoir 5.

Thus, when a cooling fluid, for example water, is made to flow through the package 1 between the intake pipe 6 and the discharge pipe 7, said fluid flows in parallel along said longitudinal channels 17 and effectively removes the heat generated by the laser diodes of the semiconductor strips 9 (see the arrows in FIGS. 1 and 2).

Electrodes 20 and 21 are electrically connected to the metal films 11 of the end plates of the assembly 2 and allow the diode strips to be electrically connected in series to the terminals of a DC or pulsed power supply. In one embodiment of the device according to the invention, current pulses having an intensity of 100 amps and durations of about 200 to 400 microseconds were used.

Thus, it may be seen that it is possible, with the device of the present invention, to obtain:
a high density and good homogeneity of the laser radiation, because of the compactness of the assembly of the laser diode strips 9;
a long lifetime for said device, because of the effective removal of heat from the active region of the laser diodes; and
automation of the manufacture of said device, making it possible to reduce the manufacturing costs thereof.

The applications of the laser diode device of the present invention are numerous and relate, for example, to the pumping of solid-state lasers, to fiber-optic links, to the laser treatment of materials, to medicine, etc.

What is claimed is:

1. A laser-diode device, comprising:
 a plurality of parallel and spaced-apart walls (8), made of a material which is a good heat conductor, which have at least approximately coplanar free longitudinal edges (10) bearing films (11) of an electrically conductive material which extend on each side of said edges on a pair of faces (8A, 8B) of said walls;
 a plurality of semiconductor strips (9) incorporating laser diodes, each strip comprising an emitting surface (12) via which said laser diodes of a corresponding strip emit, said semiconductor strips (9) being housed longitudinally in spaces between said walls (8) and each of said semiconductor strips (9) being fastened to opposite faces of two of said walls (8) between which each said strip is housed, so that said semiconductor strips (9) are electrically connected in series by films of electrically conductive material and so that said emitting surfaces (12) of said semiconductor strips (9) are at least approximately coplanar with said free longitudinal edges (10) of said walls (8); and fluid-circulation cooling means that cool said strips (9), wherein said parallel and spaced-apart walls are formed by individual plates (8) joined together, with said semiconductor strips (9) interposed between said plates as spacers, wherein said semiconductor strips (9) occupy only one longitudinal part of said spaces between said plates (8), in which spaces said strips (9) are housed, wherein said longitudinal parts of said spaces between said plates (8) which are not occupied by said semiconductor strips (9) serve as circulation channels (17) for cooling fluid, and wherein said laser-diode device additionally comprises sealing means (18) disposed in said spaces between said plates (8) that separate said longitudinal parts occupied by said strips (9) from said longitudinal parts not occupied by said strips (9).

2. A laser-diode device according to claim 1 including a package (1) comprising:

a housing (3) for a one-piece assembly (2) comprising said plates (8) and said semiconductor strips (9);

means (6) for intake of said cooling fluid into said housing (3); and means (7) for discharge of said cooling fluid out of said housing (3), said cooling fluid passing through said housing (3) by flowing through said longitudinal parts of said spaces between said plates (8) which are not occupied by said strips (9).

3. A laser-diode device according to claim 2, wherein said package (1) additionally comprises a cooling-fluid accumulation reservoir (4 and 5) between said intake means (6) and said housing (3) and between said housing (3) and said discharge means (7).

4. A process for producing the laser diode device specified by claim 1, comprising the steps of:

preparing a plurality of identical rectangular individual plates (8) made of a material which is a good heat conductor, at least two faces (8A, 8B) and one of said longitudinal edges (10) of said plates (8) being polished and said polished longitudinal edges (10) and lateral regions contiguous with said polished large faces (8A, 8B) being covered with films (11A, 11B, 11C) of a material which is a good electrical conductor;

preparing a plurality of identical rectangular semiconductor diode strips (9), one longitudinal edge of each of said strips (9) serving as an emitting surface to said diodes and said two faces of which are covered with electrically conductive contact films (13A, 13B);

applying said contact films of said strips against said lateral regions of said films (11A, 11B) of conductive material of said plates (8), between which are interposed electrically conductive fastening films (22A, 22B);

fastening said plates (8) and said strips (9) together via said fastening films with application of pressure; and forming said sealing means (18).

5. A process according to claim 4, wherein said lateral regions are covered with electrically conductive solder films.

6. A process according to claim 5, additionally comprising the steps of:

producing a stack of said plates (8) and said strips (9) so that each strip (9) is interposed between two of said plates (8), so that said longitudinal edges (10) of said plates that are covered with a film (11C) of electrically conductive material are at least approximately coplanar, so that said emitting surfaces (12) of said diode strips (9) are at least approximately coplanar with said longitudinal edges (10) of said plates, and so that each of said contact films (13A, 13B) of a face of one of said strips (9) is superposed with a solder film of a face of one of said plates (8); and raising said stack to a temperature corresponding to the melting point of said solder films, while subjecting said stack to pressure transversely with respect to said plates and strips, after which said stack is left to cool.

7. A process according to claim 5, additionally comprising the steps of:

covering one (11B) of said lateral films of conductive material of each plate (8) with a film (22B) of a first electrically conductive solder during preparation of said plates (8);

forming a plurality of subassemblies (16), each of which comprises a plate (8) and a strip (9), by superposing each time, a plate and a strip so that said solder film of said plate is superposed with a contact film of said strip and so that the longitudinal edge (10) of said plate is at least approximately coplanar with said emitting surface (12) of said strip, then by raising each subassembly (16) to a temperature corresponding to the melting point of said first solder while at the same time subjecting said subassembly to pressure transversely with respect to said plate and to said strip, after which said subassembly is left to cool;

in each subassembly (16), covering another (11A) of said lateral films of conductive material of a corresponding plate (8) with a film (22A) of a second electrically conductive solder having a melting point below that of said first solder;

forming a stack of said subassemblies (16) by superposing them, each time so that on of said contact films (13B) of said strip of one subassembly is applied against said film (22A) of said second solder of said plate of another subassembly (16) and so that said longitudinal edges of said plates are at least approximately coplanar with each other and with said emitting surfaces of said strips; and raising said stack of subassemblies (16) to a temperature corresponding to the melting point of said second solder, while at the same time subjecting said stack to pressure transversely with respect to said plates and strips, after which said stack of subassemblies is left to cool.

* * * * *